(12) United States Patent
Ito et al.

(10) Patent No.: US 7,837,794 B2
(45) Date of Patent: Nov. 23, 2010

(54) VAPOR PHASE GROWTH APPARATUS AND VAPOR PHASE GROWTH METHOD

(75) Inventors: Hideki Ito, Shizuoka (JP); Shinichi Mitani, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 12/053,657

(22) Filed: Mar. 24, 2008

(65) Prior Publication Data

US 2008/0236477 A1 Oct. 2, 2008

(30) Foreign Application Priority Data

Mar. 29, 2007 (JP) ............... 2007-086578

(51) Int. Cl.
*C30B 21/02* (2006.01)
(52) U.S. Cl. ............... 117/200; 117/202; 117/900; 118/715; 118/720; 118/723 VE; 118/724
(58) Field of Classification Search ............... 117/200, 117/202, 900; 118/715, 720, 723 VE, 724, 118/729; 219/390
See application file for complete search history.

(56) References Cited

U.S. PATENT DOCUMENTS

| | | | | |
|---|---|---|---|---|
| 5,345,534 | A | * | 9/1994 | Najm et al. ............... 392/422 |
| 7,432,475 | B2 | * | 10/2008 | Nakajima et al. ............ 219/390 |
| 2007/0023869 | A1 | * | 2/2007 | Furutani et al. ............. 257/629 |
| 2007/0026148 | A1 | * | 2/2007 | Arai et al. ................ 427/248.1 |
| 2008/0236477 | A1 | * | 10/2008 | Ito et al. ....................... 117/86 |

FOREIGN PATENT DOCUMENTS

| | | | |
|---|---|---|---|
| JP | 2001-345271 | | 12/2001 |
| JP | 2001345271 | * | 12/2001 |
| WO | WO2004030064 A1 | * | 4/2004 |
| WO | WO2004030065 A1 | * | 4/2004 |

* cited by examiner

*Primary Examiner*—Robert M Kunemund
(74) *Attorney, Agent, or Firm*—Finnegan, Henderson, Farabow, Garrett & Dunner, L.L.P.

(57) ABSTRACT

A vapor phase growth apparatus and a vapor phase growth method improve the uniformity of film formed are provided. The vapor phase growth apparatus includes a chamber, a rotatable holder having a susceptor, an internal heater and an external heater which are arranged in the holder and heat the wafer from the bottom surface, an gas-pipe which is arranged to face the internal heater and sprays a cooling gas, and a temperature measuring unit which is arranged outside the chamber and measures the surface temperature of the wafer. In this manner, a position of a singular point of temperature which is an overheated portion generated on the wafer can be recognized. The singular point of temperature is locally cooled to make it possible to improve the uniformity of a temperature distribution in plane of the wafer.

11 Claims, 5 Drawing Sheets

VAPOR PHASE GROWTH APPARATUS AND VAPOR PHASE GROWTH METHOD

CROSS REFERENCE TO RELATED APPLICATION

This application is based upon and claims the benefit of priority from Japanese Patent Application No. 2007-086578, filed on Mar. 29, 2007, the entire contents of which are incorporated herein by reference.

FIELD OF THE INVENTION

The present invention relates to a vapor phase growth apparatus and a vapor phase growth method. In particular, the present invention relates to, in an epitaxial growth apparatus, a means which realizes a uniform temperature distribution on the entire surface of a silicon wafer to be heated so as to improve the uniformity of the thickness of an epitaxial growth film to be formed.

BACKGROUND OF THE INVENTION

In manufacturing of a semiconductor device such as an ultra-high speed bipolar or an ultra-high speed CMOS, an epitaxial growth technique for a single crystal, the impurity concentration and film thickness of which are controlled, is an inevitable to improve the performance of the semiconductor device. As an epitaxial growth method to generate a thin single crystal film on a wafer, an atmospheric pressure chemical vapor phase growth method is generally used. Depending on the cases, a low-pressure chemical vapor deposition (LPCVD) method is used. A wafer is put in a chamber, an atmospheric pressure (0.1 Mpa (760 Torr)) or a vacuum atmosphere having a predetermined degree of vacuum is kept in the chamber, and a process gas obtained by mixing a silicon source with a dopant such as a boron compound, a phosphorous compound, or an arsenic compound is supplied into the chamber while keeping the wafer heated and rotated. On a surface of the heated wafer, a thermal decomposition reaction or a hydrogen reduction reaction is performed to generate a single crystal thin film doped with boron (B), phosphorous (P), or arsenic (As).

For example, in order to manufacture a semiconductor device such as an IGBT (insulating gate bipolar transistor), an epitaxial growth technique which generates a thick and uniform high-quality single crystal film is required. For example, in a conventional MOS device or the like, only a film thickness of several μm or less is necessary. However, in an IGBT or the like, a film thickness of several micro-meters to one hundred and several tens of micro-meters is necessary. For this reason, the wafer is rotated at a high speed to always supply a new gas onto the wafer surface, so that a growth rate of a crystal film is improved. Furthermore, the wafer is uniformly heated to improve the in-plane uniformity of the thickness of the film to be formed.

Figure 7:
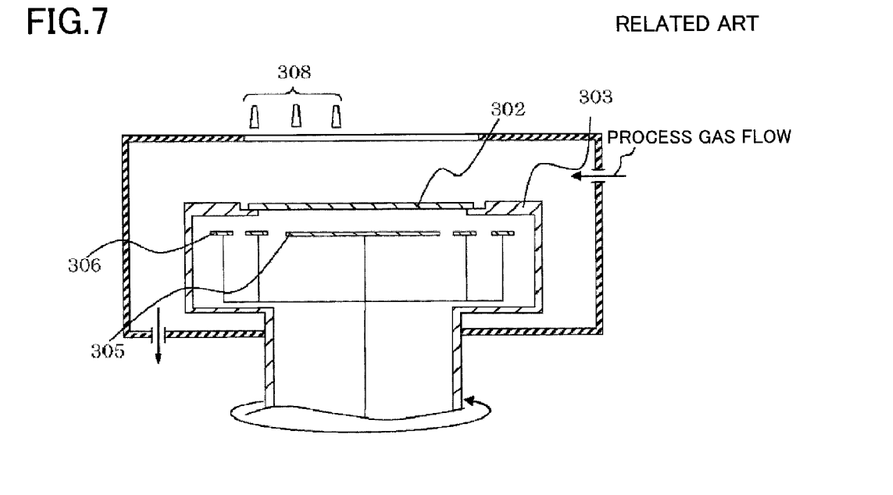
FIG. 7 is a conceptual view for explaining a configuration of a conventional vapor phase growth apparatus.
Figure 8:
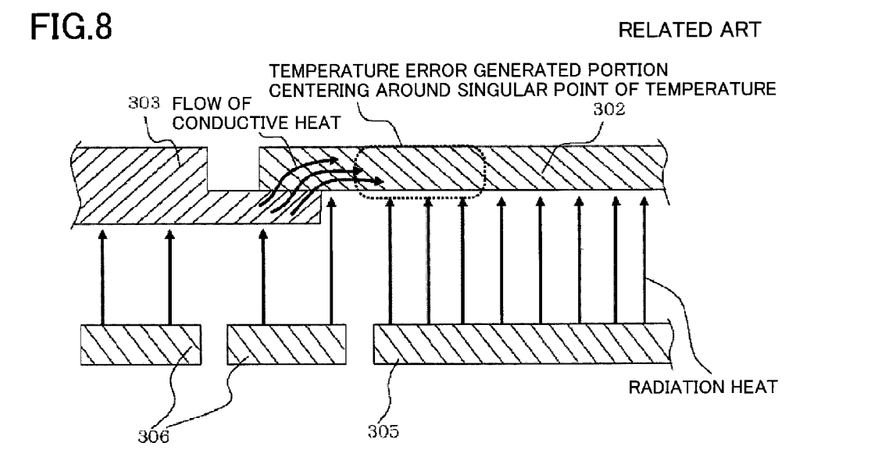
FIG. 8 is a diagram of a problem of the conventional vapor phase growth apparatus.

FIG. 7 is a conceptual diagram showing a conventional vapor phase growth apparatus in which a plurality of heaters are arranged to uniformly heat a wafer. FIG. 8 is an explanatory diagram of a problem of the conventional vapor phase growth apparatus shown in FIG. 7. FIG. 8 shows a manner by which a wafer 302 is heated while controlling an internal heater 305 and an external heater 306 on the basis of temperature information measured by a temperature measuring unit 308 shown in FIG. 7. When the wafer 302 is heated by using both the internal heater 305 and the external heater 306, a central portion of the wafer 302 is heated by receiving radiation heat from the internal heater 305. The edge portion of the wafer 302 is heated by giving conductive heat through the susceptor 303 heated by the external heater 306. At this time, a high-temperature region which is overheated to a temperature higher than those of the central portion and the edge portion of the wafer 302 is generated in the plane of the wafer 302 (singular point of temperature) under the influence of both the radiation heat from the internal heater 305 and the conductive heat supplied from the external heater 306 through the susceptor 303. As a result, the thickness of a crystal film generated around the singular point of temperature of the wafer 302 becomes abnormal.

When a vapor phase growth reaction is to be executed, the wafer 302 is placed such that the edge portion of the wafer 302 is in contact with the susceptor 303. In this case, since heat is easily transmitted from the edge portion of the wafer 302 to the susceptor 303 and let out of the susceptor 303, the temperature of the wafer edge portion decreases, and the in-plane temperature distribution of the wafer is not uniform. In order to cope with this, as shown in FIGS. 7 and 8, a plurality of heaters are arranged to supplementary heat the edge portion of the wafer 302 and to suppress a decrease in temperature of the edge portion of the wafer 302. However, due to the countermeasure, according to the above description, a state in which a singular point of temperature is generated in another region in plane of the wafer 302 is disadvantageously caused.

In this case, even though a power of any one of the internal heater 305 and the external heater 306 or power of both of them are controlled to try to correct the ununiformity of the in-plane temperature distribution of the wafer 302, it is difficult to completely eliminate a singular point of the temperature distribution. As a result, the temperature distribution in the entire surface of the wafer 302 cannot be made uniform, and formation of a crystal film having a uniform thickness cannot be realized. Furthermore, when the in-plane temperature distribution of the wafer 302 is not uniform in a vapor phase growth reaction, a crystal defect occurs in the crystal film to be formed, and a wafer having quality enough to be used to manufacture a high-performance semiconductor device cannot also be produced (see JP-A 2001-345271 (KOKOAI)).

BRIEF SUMMARY OF THE INVENTION

As described above, in the conventional vapor phase growth apparatus, a temperature distribution in wafer plane cannot be sufficiently made uniform because of its structure. For this reason, the uniformity of the film thickness of a crystal film to be formed on a wafer surface cannot be improved. Therefore, present inventors examined a technique which cancels the ununiformity of a temperature distribution generated in plane of the wafer 302 by locally adjusting the temperature of the internal heater 305 or the external heater 306 without controlling power of heaters to adjust the temperature of the wafer 302.

The present invention is based on the above circumstances and provides a vapor phase growth apparatus and a vapor phase growth method which improve the uniformity of a temperature distribution in plane of a wafer to be heated to improve the uniformity of the film thickness of a crystal film to be formed on a wafer surface.

The vapor phase growth apparatus according to the present invention includes, a chamber, a rotatable holder stored in the chamber and having a susceptor on which a wafer is placed, a heater which is arranged in the holder and heats the wafer placed on the susceptor, a gas-pipe which is arranged to face the heater and sprays a cooling gas onto the heater and a temperature measuring unit which is arranged outside the chamber and measures the temperature of the wafer surface.

The vapor phase growth method according to the present invention is a vapor phase growth method which places a wafer on a susceptor of a holder stored in a chamber, supplies a process gas onto the wafer, and heats the wafer by a heater arranged in the holder to perform a vapor phase growth reaction. The method includes, measuring the surface temperature of the wafer by using a temperature measuring unit and controlling the surface temperature of the wafer by spraying a cooling gas onto the heater to make the surface temperature a predetermined uniform temperature.

According to the present invention, a part of the wafer overheated by the heater is cooled to make it possible to improve the uniformity of an in-plane temperature distribution. For this reason, a distribution of the film thickness of a crystal film to be formed can be made uniform.

DETAILED DESCRIPTION OF THE EMBODIMENTS

Embodiment 1

A first embodiment will be described below in detail with reference to the accompanying drawings. A vapor phase growth apparatus 100 in FIG. 1 includes a chamber 101, a rotatable holder 104 having a susceptor 103 on which a wafer 102 stored in the chamber 101 is placed, and an internal heater 105 and an external heater (second heater) 106 which are arranged in the holder 104. The internal heater 105 and the external heater 106 heat the wafer 102 from the bottom surface of the wafer 102. The vapor phase growth apparatus 100 includes gas-pipes 107 which is arranged to face the internal heater 105 and sprays a cooling gas, and a temperature measuring unit 108 which measures a surface temperature of the wafer 102.

Figure 1:
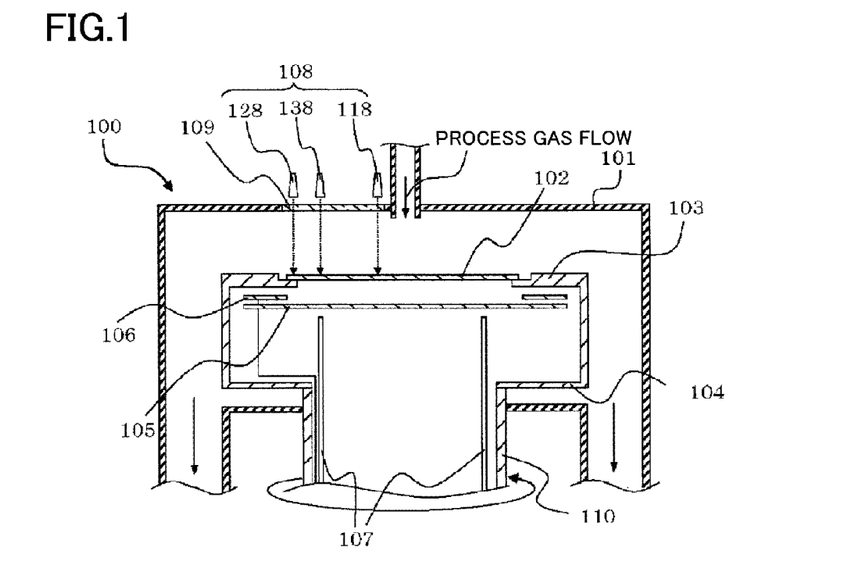
FIG. 1 is a schematic sectional view for explaining a configuration of a vapor phase growth apparatus according to a first embodiment of the present invention.

In this case, of the members required to form a crystal film on the surface of the wafer 102, members except for configurations required to explain the first embodiment will be omitted in explanation. A reduction scale or the like of each of the members shown in FIG. 1 is not matched with that of the real thing.

Above the holder 104, the circular plate-like susceptor 103 is arranged. The wafer 102 is placed on a recessed portion formed in the susceptor 103. An penetrating opening is formed at the center of the recessed portion. Radiation heat from the internal heater 105 and the external heater 106 arranged in the holder 104 can be directly received by the wafer 102 through the opening. The internal heater 105 is a heat source formed by a resistive material plate having an approximately circular contour. In the resistive material plate, a slit is formed to form a conductive path. The internal heater 105 heats the center portion of the wafer 102. The external heater 106 is a heat source obtained by forming a slit to form a conductive path in a resistive material plate having a ring-like contour. The external heater 106 heats both the edge portion of the wafer 102 and the susceptor 103. When the external heater 106 is heated, heating of the edge portion of the wafer 102 out of which heat is easily let because of being in contact with the susceptor 103 is assisted, and a decrease in temperature of the wafer edge portion can be suppressed.

However, in the above temperature control method, the region which receives the radiation heat from the internal heater 105 and the external heater 106 and the conduction heat from the susceptor 103 is generated in plane of the wafer 102. For this reason, a point (singular point of temperature) having a temperature higher than that of another portion is generated in a region 5 mm to 20 mm away from the edge of the wafer 102. Due to the presence of the singular point of temperature, ununiformity of the temperature distribution in plane of the wafer 102 becomes large.

Figure 2:
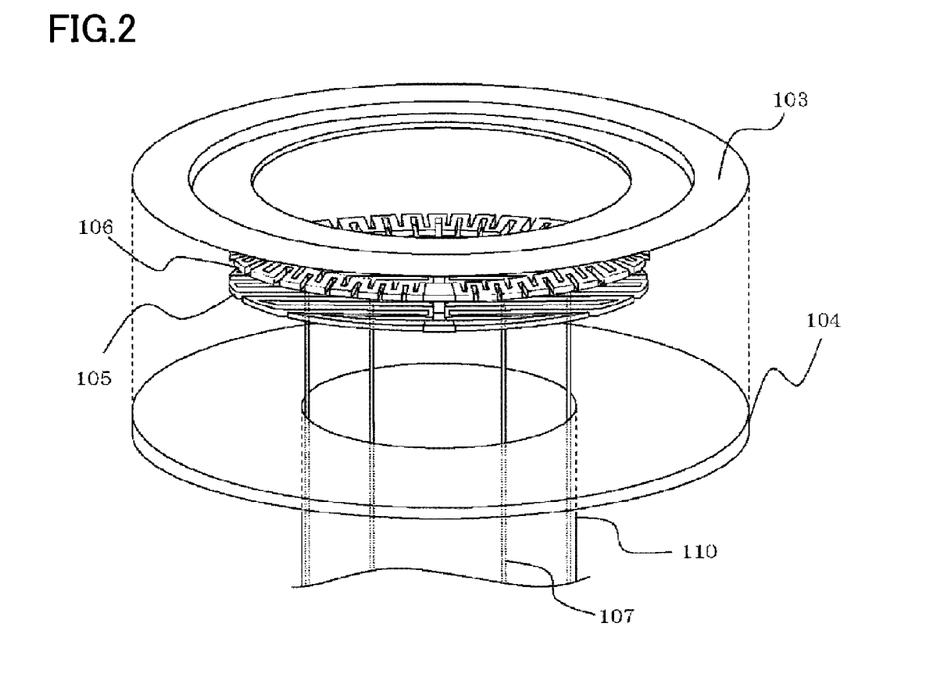
FIG. 2 is a perspective partially cutaway view of an inside of a holder according to the first embodiment of the present invention.
Figure 3:
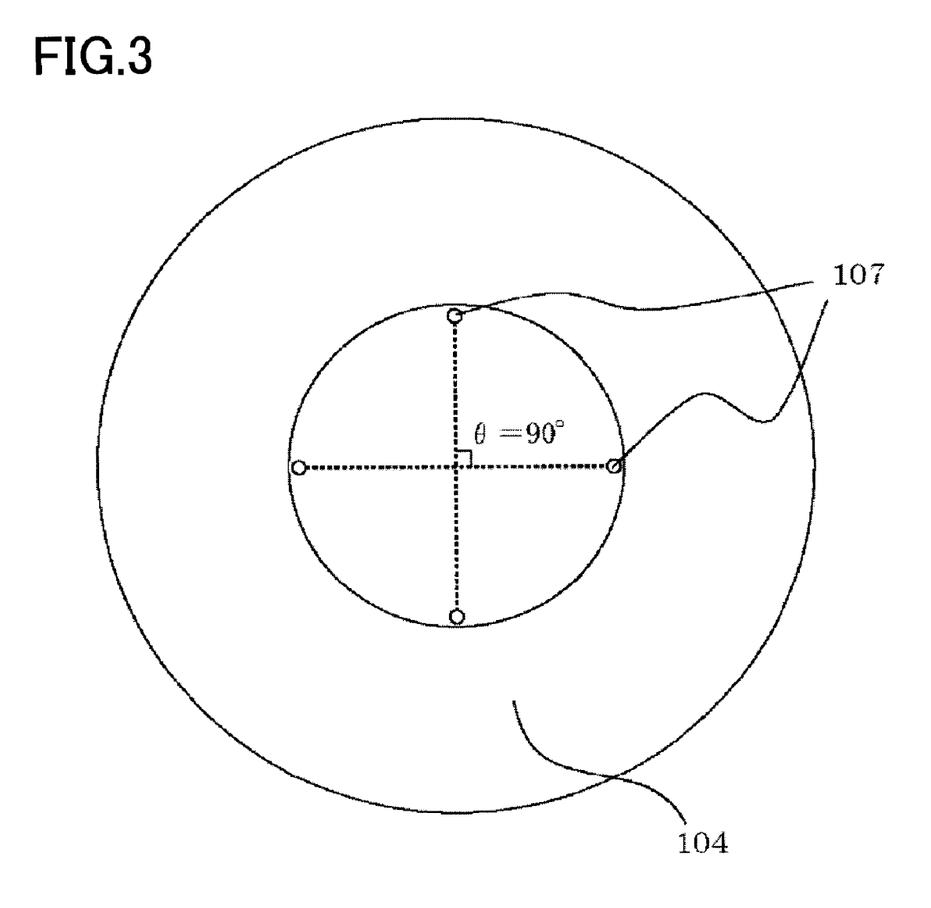
FIG. 3 is a schematic view showing a bottom portion of the holder according to the first embodiment of the present invention when viewed from above.

In order to overcome the problem to improve the uniformity of the temperature distribution in plane of the wafer 102, in the first embodiment, a mechanism which locally cools the internal heater 105 is arranged. The mechanism indirectly cools the wafer 102. FIG. 2 is a perspective partially cutaway view showing the holder 104 in which the wafer 102 is not placed on the susceptor 103 and an internal structure of the holder according to the first embodiment of the present invention. FIG. 3 is a schematic view showing a bottom portion in the holder 104 shown in FIG. 2 when viewed from above.

As shown in FIG. 2, a rotating barrel 110 under the holder 104 is connected to a rotating mechanism (not shown) arranged outside the chamber 101 and can be rotated. As shown in FIG. 3, the gas-pipes 107 which spray a cooling gas are arranged through the inside of the rotating barrel 110 to have spraying ports facing the internal heater 105. These gas-pipes 107 are arranged at equal intervals of 90° on the same circumference of a horizontal section of the rotating barrel 110. More specifically, the gas-pipes 107 are arranged at equal intervals on a circumference centering around a center of rotation center of the holder 104. With this configuration, when the wafer 102 rotates, cooling gases can be sprayed from the gas-pipes 107 such that four points of the internal heater 105 which heats the circumference of the wafer 102 are locally cooled from the bottom surface.

The wafer 102 rotates with rotation of the holder 104. For this reason, when the four points of the internal heater 105 immediately under the wafer 102 are cooled, portions facing the four points on the circumference of the wafer 102 are cooled.

Although the four gas-pipes 107 are arranged in the first embodiment, the number of gas-pipes 107 to be arranged is not limited to four. One or four or more gas-pipes 107 which can spray cooling gases onto the internal heater 105 may be used. Furthermore, as the material of the gas-pipe 107, quartz, silicon carbide (SiC), or the like which is in less danger of causing metal contamination, particle contamination, or the like in the chamber 101 may be used.

Figure 4:
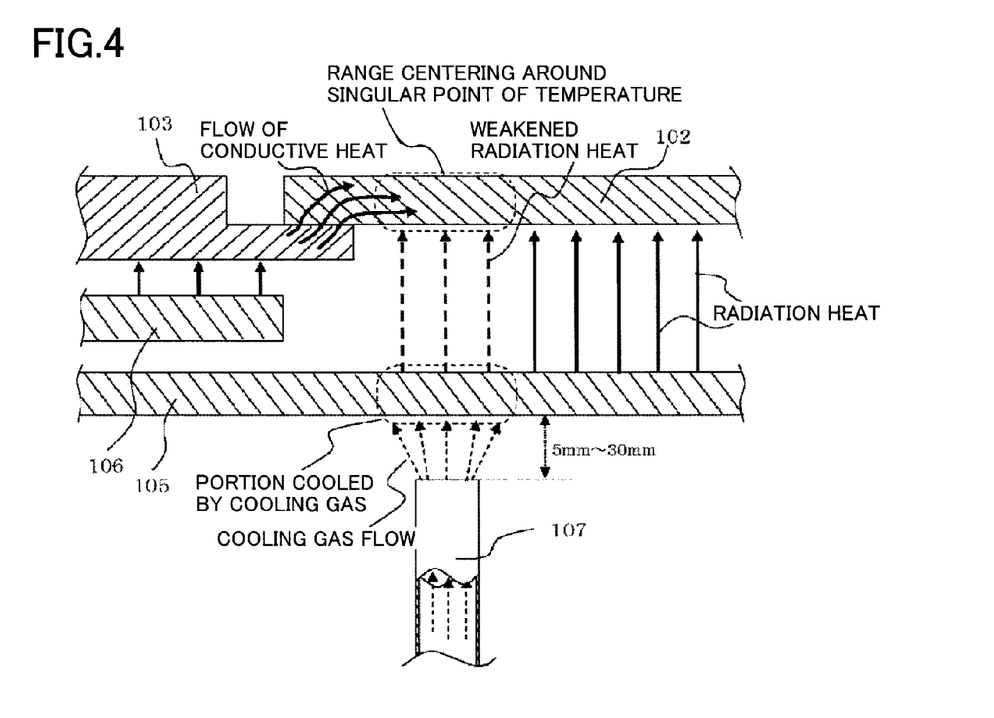
FIG. 4 is a diagram for explaining an operation of a gas-pipe in the first embodiment of the present invention.

FIG. 4 is an explanatory diagram of an operation of an gas-pipe. The internal heater 105 and the external heater 106 heat the wafer 102 and the susceptor 103. With this heating, a singular point of temperature is generated in the wafer 102. The gas-pipe 107 arranged to have a distal end located 5 mm to 30 mm below the lower surface of the internal heater 105 sprays a cooling gas to cool a portion of the internal heater 105 heating the singular point of temperature of the wafer 102, i.e., the internal heater immediately below an overheated portion of the wafer from the bottom surface.

In this case, as the cooling gas sprayed from the gas-pipe 107, an atmospheric temperature hydrogen ($H_2$) gas or the like which has no danger of disturbing an environment of a vapor phase growth reaction in the chamber 101 may be used. It is preferable that a flow rate of the cooling gas is 100 SCCM (Standard Cubic Centimeter per Minutes) ($=1.69 \times 10^{-1}$ $Pam^3$/S) to 5 SLM (Standard Liter per Minutes) ($=8.45$ $Pam^3$/S).

A cooling gas flowing at a predetermined flow rate is sprayed onto a predetermined position of the internal heater 105 and cools the internal heater 105 to weaken the radiation heat from the internal heater 105 to the singular point of temperature which is the overheated portion generated in the wafer 102 so as to locally suppress the heating. The cooling gas is sprayed to make it possible to indirectly and locally cool the wafer 102, so that the uniformity of a temperature distribution in plane of the wafer 102 can be improved.

The internal heater 105 generates heat to a temperature of about 1400° C. to 1500° C. to heat the wafer 102 to 1100° C. or more. For this reason, since an amount of heat generated by the internal heater 105 itself is large even though atmospheric temperature $H_2$ or the like is directly sprayed to perform cooling, the temperature of the internal heater 105 does not change so sharply that the internal heater 105 is damaged by heat stress. Therefore, a special cooling gas temperature adjusting mechanism need not be arranged in the cooling gas supply unit, and the cooling gas may be directly supplied while being kept at an atmospheric temperature.

As shown in FIG. 1, a window 109 is arranged on the upper surface of the chamber 101, so that the inside of the chamber 101 can be visually checked. The temperature measuring unit 108 is arranged to face the surface of the wafer 102 through the window 109 to measure the temperature of the surface of the wafer 102. The temperature measuring unit 108 has a plurality of radiation thermometers. The radiation thermometers are controlled to measure the surface temperature of the wafer 102 in cooperation with each other. In the first embodiment, the three radiation thermometers are arranged.

In this case, a radiation thermometer 118 is arranged to measure the temperature of the central portion of the wafer 102 heated by radiation heat from the internal heater 105. On the basis of the measured temperature information, the radiation thermometer 118 controls an output from the internal heater 105 to adjust the temperature of the central portion of the wafer 102. A radiation thermometer 128 is arranged to measure the temperature of the edge portion of the wafer 102 which is a part heated by conductive heat from the heated susceptor 103. The radiation thermometer 128 controls a thermal output from the external heater 106 on the basis of the measured temperature information to adjust the temperature of the edge portion of the wafer 102. A radiation thermometer 138 is arranged to measure the temperature of the singular point of temperature in plane of the wafer 102.

In this case, in order to specify a position where the singular point of temperature is generated in plane of the wafer 102, thermal analysis of a relationship between the wafer 102, the internal heater 105, and the external heater 106 is performed in advance. The radiation thermometer 138 is arranged at a position where a variation in temperature of the singular point of temperature specified by the above result can be captured.

On the basis of the temperature information measured as described above, in order to make a temperature distribution in plane of the wafer 102 uniform, the cooling gas the flow rate of which is controlled to a predetermined flow rate is sprayed from the gas-pipe 107 onto the internal heater 105. In this manner, the portion of the internal heater 105 which heats an overheated portion of the wafer 102 can be cooled to a predetermined temperature, and, indirectly, the wafer 102 can be cooled. An abnormal temperature distribution centering around the singular point of temperature generated in the wafer 102 can be eliminated.

As described above, the temperatures at the three points in plane of the wafer 102 are controlled to obtain a uniform temperature distribution from the central portion of the wafer 102 to the edge portion of the wafer 102. A process gas containing a material component which generates a crystal film is supplied onto the wafer 102 having the improved uniformity of the temperature distribution. A thermal decomposition reaction or a hydrogen reduction reaction uniformly occurs on the surface of the wafer 102, and a crystal film the thickness of which is uniformly controlled can be formed. In this manner, by using the vapor phase growth apparatus and the vapor phase growth method according to the embodiment, a high-quality wafer which is required to manufacture a high-performance semiconductor device, the film thickness of which is uniformly controlled, and which is free from a crystal defect can be manufactured.

The process gas supplied in the embodiment is constructed such that, for example, a predetermined dopant gas is added to a gas mixture of a silicon film forming gas such as monosilane ($SiH_4$), dichlorosilane ($SiH_2Cl_2$), or trichlorosilane ($SiHCl_3$) and $H_2$ serving as a carrier gas.

As the dopant gas, boron-based diborane ($B_2H_6$), phosphorous-based phosphine ($PH_3$), or the like is used. Adding phosphine can form a crystal film of a p-type conductivity type, and adding phosphine can form a crystal film of an n-type conductivity type.

Embodiment 2

Figure 5:
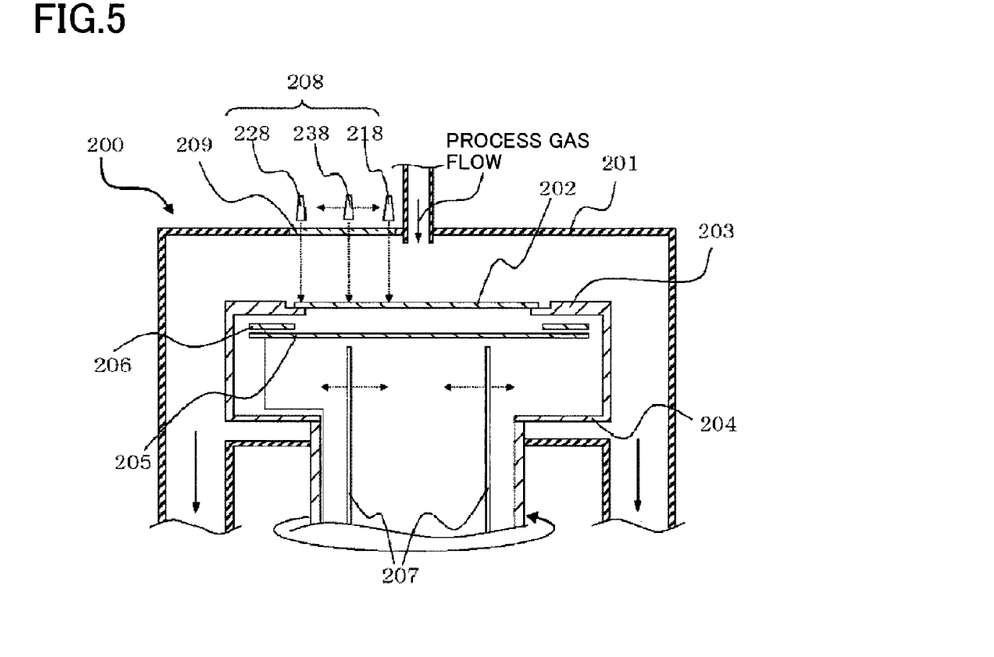
FIG. 5 is a schematic sectional view of a vapor phase growth apparatus according to a second embodiment of the present invention.

A second embodiment will be described below in detail on the basis of the accompanying drawings. FIG. 5 is a conceptual diagram showing a vapor phase growth apparatus 200 including an gas-pipe 207 which can move a cooling portion of an internal heater 205 when the position of a singular point of temperature generated in a wafer 202 by a variation in environment of a vapor phase growth reaction, a change of members, or the like.

The position of the singular point of temperature generated in the wafer 202 varies due to changes of various conditions such as a change of a balance between radiation heat and conductive heat by variations of the distances between the wafer 202, the internal heater 205, and an external heater 206 or a change of an amount of heat by a variation in area and thickness of a susceptor 203. This embodiment will explain a vapor phase growth apparatus in which the position of the singular point of temperature is recognized by a temperature measuring unit 208 even under any condition and moves the position of the gas-pipes 207 depending on the position of the singular point of temperature to spray a cooling gas.

The temperature measuring unit 208 measures the surface temperature of the wafer 202 through a window 209 arranged in the upper surface of a chamber 201. At this time, a radiation thermometer 228 measures the temperature of the edge portion of the wafer 202 heated by radiation heat from the internal heater 205 and the external heater 206 and conductive heat from the susceptor 203. On the basis of information of the measured temperature, thermal outputs from the internal heater 205 and the external heater 206 are controlled.

A radiation thermometer 238 measures the temperature of the wafer 202 while radially moving in a predetermined distance between a wafer part measured by a radial thermometer 218 in plane of the wafer 202 and a wafer portion measured by the radiation thermometer 228. Three pieces of temperature information of the wafer 202 measured by the radial thermometers 218, 228, and 238 are acquired to make it possible to recognize a temperature distribution in the radial direction in plane of the wafer 202. As a result, a portion where a singular point of temperature in plane of the wafer 202 is generated can be detected, and a variation of the position of the singular point of temperature generated in plane of the wafer 202 can be captured.

The gas-pipes 207 is moved such that the cooling gas can be sprayed onto the portion of the internal heater 205 which heats the singular point of temperature of the wafer 202. After the gas-pipes 207 is moved, a cooling gas having a predetermined flow rate which makes the temperature distribution in plane of the wafer 202 uniform is sprayed from the gas-pipes 207 to cool the internal heater 205. The internal heater 205 is cooled to make it possible to indirectly cool the singular point of temperature of the wafer 202.

Figure 6:
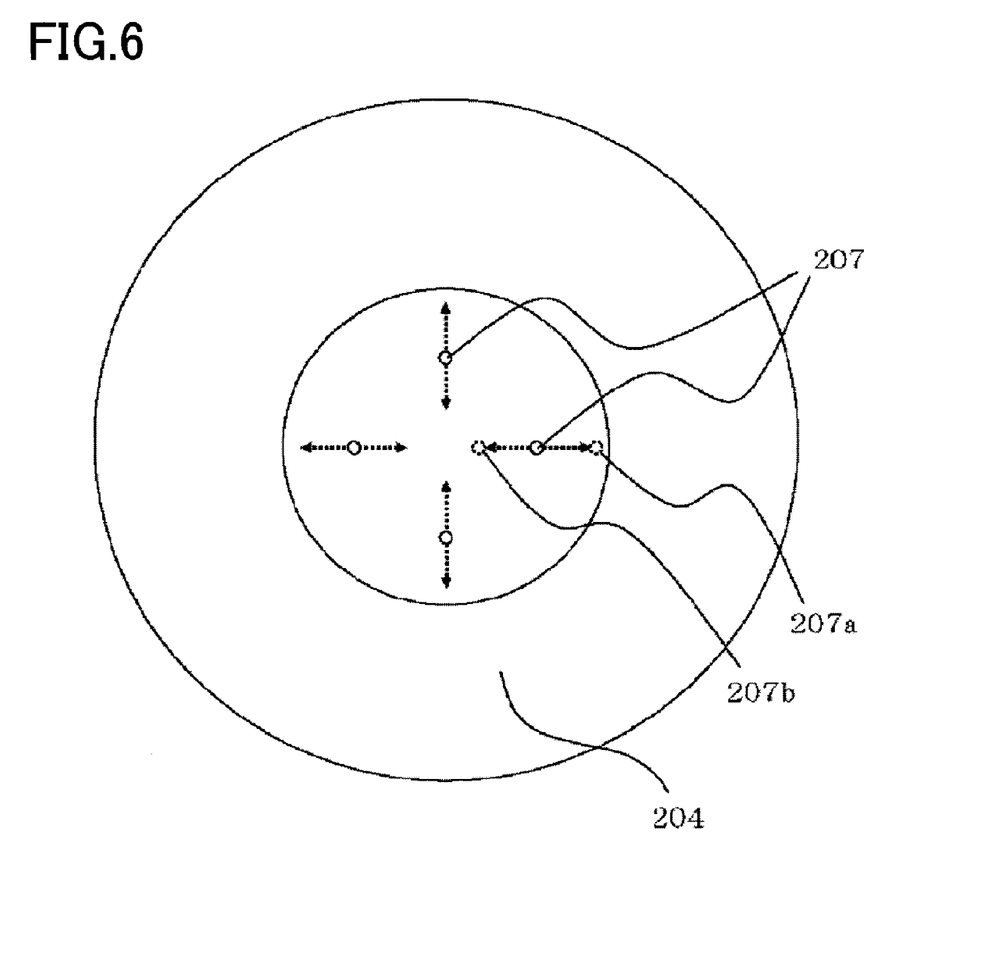
FIG. 6 is a schematic view showing a bottom portion and a movable gas-pipe in the holder according to the second embodiment of the present invention when viewed from above.

FIG. 6 is a conceptual diagram showing a manner in which the gas-pipe 207 can move for a predetermined distance between a position immediately under the edge portion indicated by 207a and a position immediately under a central portion indicated by 207b. When the temperature measuring unit 208 captures the singular point of temperature in plane of the wafer 202, the gas-pipe 207 is arranged such that all the four gas-pipes 207 synchronously move for equal distances to a position of the internal heater 205 which heats the singular point of temperature to cool the position of the internal heater 205 immediately under the singular point of temperature (overheated portion) of the wafer 202. In this manner, an increase in temperature at the singular point of temperature generated in the wafer 202 can be eliminated, and a uniform in-plane temperature distribution can be obtained.

The description of contents overlapping the contents described on the basis of FIGS. 1 to 4 such as the formation of the crystal film by supplying the process gas onto the wafer 202 or rotation of the wafer 202 with rotation of a holder 204 by a rotating mechanism (not shown) will be omitted.

The embodiments are described with reference to the concrete examples. The present invention is not limited to the above embodiments, and various changes of the invention can be effected without departing from the spirit and scope of the invention.

For example, in the second embodiment, the position of the singular point of temperature can be captured by arranging the movable radiation thermometer 238 even though the position moves. However, not only the temperature measuring unit 208 having a plurality of radiation thermometers but also a radiation thermometer using a scheme which scans a wafer in a radial direction in a predetermined width can be used. According to the scheme, only one radiation thermometer is arranged to make it possible to recognize a temperature distribution in the radial direction of the wafer. When the temperature distribution of the wafer in the radial direction is recognized, temperature measurement to control outputs from an internal heater and an external heater and temperature measurement to capture the singular point of temperature on the wafer can be simultaneously performed.

Furthermore, in the second embodiment, the plurality of movable gas-pipes are synchronously moved to make it possible to cool the same circumference of the wafer. However, the movements of the plurality of gas-pipes may be asynchronized with each other. For example, each two of the gas-pipes arranged symmetrical with a central point of the holder 204 are paired, and the pairs are independently moved to make it possible to equally cool two points of the wafer in the radial direction. According to this method, even though a plurality of singular points of temperature on the wafer is generated, the gas-pipes are independently moved to make it possible to correct the ununiformity of the temperature. For this reason, a further uniform temperature distribution in plane of the wafer can be obtained.

The present invention describes an epitaxial growth apparatus as an example of a vapor phase growth apparatus. The present invention is not limited to this. The present invention may be applied to another vapor phase growth apparatus to form a predetermined crystal film on a wafer surface. For example, the apparatus may be an apparatus or the like to grow a polysilicon film.

Furthermore, parts such as a configuration of the apparatus or a control method which is not directly necessary for the present invention are omitted. However, the necessary configuration of the apparatus, the necessary control apparatus, and the like are arbitrarily selected.

Furthermore, all vapor phase growth apparatuses which include the elements of the present invention and which can be arbitrarily changed by a person skilled in the art, and the shapes of the members of the vapor phase growth apparatuses are included in the spirit and scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vapor phase growth apparatus, comprising:
   a chamber;
   a rotatable holder in the chamber having a susceptor on which a wafer is placed;
   a heater which is arranged in the holder, below the susceptor, and heats the wafer placed on the susceptor;
   a gas-pipe, in the holder, which is arranged to face the heater and sprays a cooling gas toward the heater during heating of the wafer to locally cool the heater; and
   a temperature measuring unit which is arranged outside the chamber and measures the temperature of a surface of the wafer,
   wherein a plurality of gas-pipes is arranged to face the heater and sprays a cooling gas toward the heater, and
   the gas-pipes are arranged at equal intervals on a circumference centering around a center of rotation of the holder.

2. The apparatus according to claim 1,
   wherein the gas-pipe is arranged to face a portion of the heater which overheats the wafer.

3. A vapor phase growth apparatus, comprising:
   a chamber;
   a rotatable holder in the chamber having a susceptor on which a wafer is placed;
   a heater which is arranged in the holder, below the susceptor, and heats the wafer placed on the susceptor;

a gas-pipe, in the holder, which is arranged to face the heater and sprays a cooling gas toward the heater during heating of the wafer to locally cool the heater; and a temperature measuring unit which is arranged outside the chamber and measures the temperature of a surface of the wafer, wherein the gas-pipe sprays a cooling gas the flow rate of which is controlled on the basis of the surface temperature of the wafer measured by the temperature measuring unit.

4. The apparatus according to claim 3, further comprising a second heater which heats the susceptor.

5. The apparatus according to claim 1, wherein the gas-pipe can be moved in a horizontal direction.

6. The apparatus according to claim 1, wherein the plurality of gas-pipes can be synchronously moved.

7. The apparatus according to claim 1, wherein the temperature measuring unit is constituted by a plurality of radial thermometers.

8. A vapor phase growth apparatus, comprising:

a chamber;

a rotatable holder in the chamber having a susceptor on which a wafer is placed;

a heater which is arranged in the holder, below the susceptor, and heats the wafer placed on the susceptor;

a gas-pipe, in the holder, which is arranged to face the heater and sprays a cooling gas toward the heater during heating of the wafer to locally cool the heater; and a temperature measuring unit which is arranged outside the chamber and measures the temperature of a surface of the wafer, and a second heater which heats the susceptor, wherein a plurality of gas-pipes are arranged to face the heater and spray a cooling gas toward the heater, and the gas-pipes are arranged at equal intervals on a circumference centering around a center of rotation of the holder.

9. The apparatus according to claim 3, wherein the gas-pipe is arranged to face a portion of the heater which overheats the wafer.

10. The apparatus according to claim 3, wherein the gas pipe can be moved in a horizontal direction.

11. The apparatus according to claim 8, wherein the gas-pipe is arranged to face a portion of the heater which overheats the wafer.

\* \* \* \* \*

UNITED STATES PATENT AND TRADEMARK OFFICE
CERTIFICATE OF CORRECTION

| | |
|---|---|
| PATENT NO. | : 7,837,794 B2 |
| APPLICATION NO. | : 12/053657 |
| DATED | : November 23, 2010 |
| INVENTOR(S) | : Ito et al. |

Page 1 of 1

It is certified that error appears in the above-identified patent and that said Letters Patent is hereby corrected as shown below:

Title page, Item (57), in the Abstract, line 2, change "improve" to --improving--.

Title page, Item (57), in the Abstract, line 6, change "an gas-pipe" to --a gas-pipe--.

Claim 10, column 10, line 19, change "gas pipe" to --gas-pipe--.

Signed and Sealed this
Twenty-second Day of March, 2011

David J. Kappos
*Director of the United States Patent and Trademark Office*